United States Patent [19]

Burns

[11] 4,063,993

[45] Dec. 20, 1977

[54] METHOD OF MAKING GANG BONDING INTERCONNECT TAPE FOR SEMICONDUCTIVE DEVICES

[75] Inventor: Carmen D. Burns, San Jose, Calif.

[73] Assignee: National Semiconductor Corporation, Santa Clara, Calif.

[21] Appl. No.: 593,474

[22] Filed: July 7, 1975

[51] Int. Cl.² .............................................. H05K 1/00
[52] U.S. Cl. ............................. 156/659; 29/577 R; 29/624; 29/625; 29/626; 96/36.2; 148/6.2; 156/644; 156/664; 156/666; 357/70; 427/96; 427/14; 427/282; 427/287; 427/289
[58] Field of Search .................. 156/17, 644, 901, 664, 156/666, 659; 427/96, 282, 287, 289, 14; 29/203 B, 577, 624, 625, 626; 148/6.2; 428/458, 901; 357/70; 96/36.2

[56] References Cited

U.S. PATENT DOCUMENTS

| | | | |
|---|---|---|---|
| 3,689,991 | 12/1972 | Aird | 29/577 |
| 3,724,068 | 4/1973 | Galli | 29/203 B |
| 3,763,404 | 10/1973 | Aird | 357/70 |
| 3,781,596 | 12/1973 | Galli et al. | 29/625 |
| 3,904,813 | 9/1975 | Groff | 428/901 |

Primary Examiner—Ralph S. Kendall
Assistant Examiner—John D. Smith
Attorney, Agent, or Firm—Gail W. Woodward; Willis E. Higgins

[57] ABSTRACT

A gang bonding interconnect tape for use in an automatic bonding machine for gang bonding of semiconductive devices is fabricated by depositing a series of electrically insulative support structures, such as rings of epoxy resin, onto a metallic tape, as of copper, there being at least one of said electrically insulative support structures for individual ones of the interconnect lead patterns to be formed in said metallic tape. The side of the metallic tape, opposite to the support structure, is photoetched with a series of interconnect lead patterns with individual ones of said lead patterns being etched in registration with individual ones of said electrically insulative support structures. The individual electrically insulative support structure, preferably in the form of a ring, is located in each of the lead patterns intermediate the central region thereof and the outer region thereof for supporting the individual leads thereof in circumferentially spaced relation.

11 Claims, 10 Drawing Figures

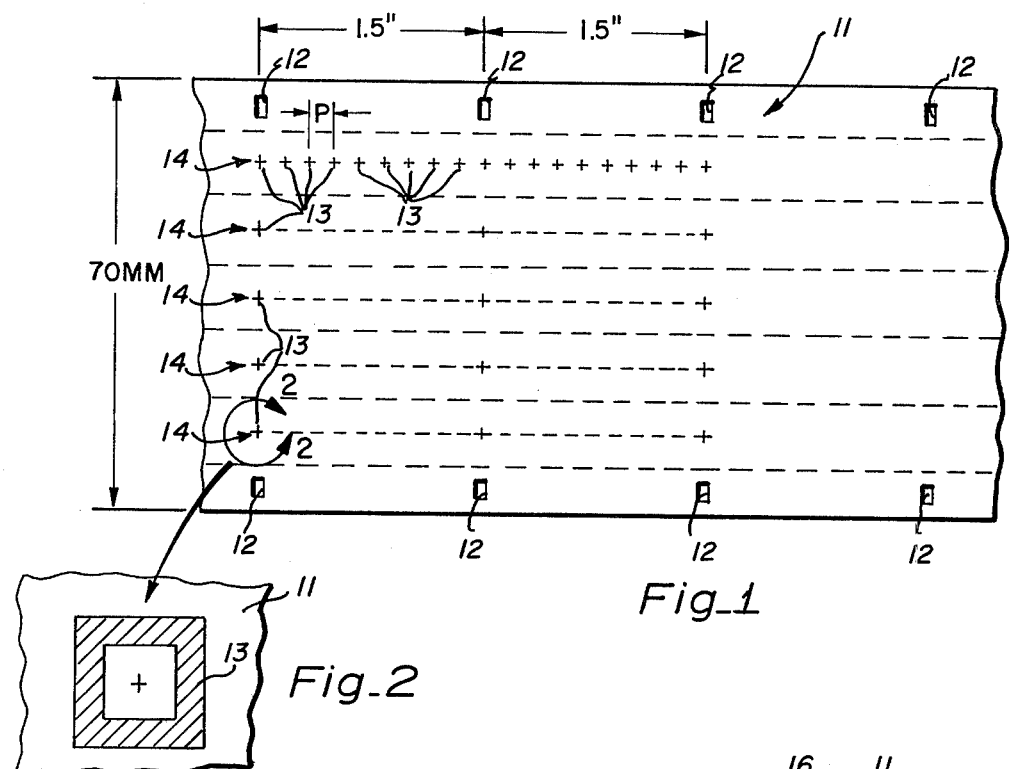
Fig_1
Fig_2
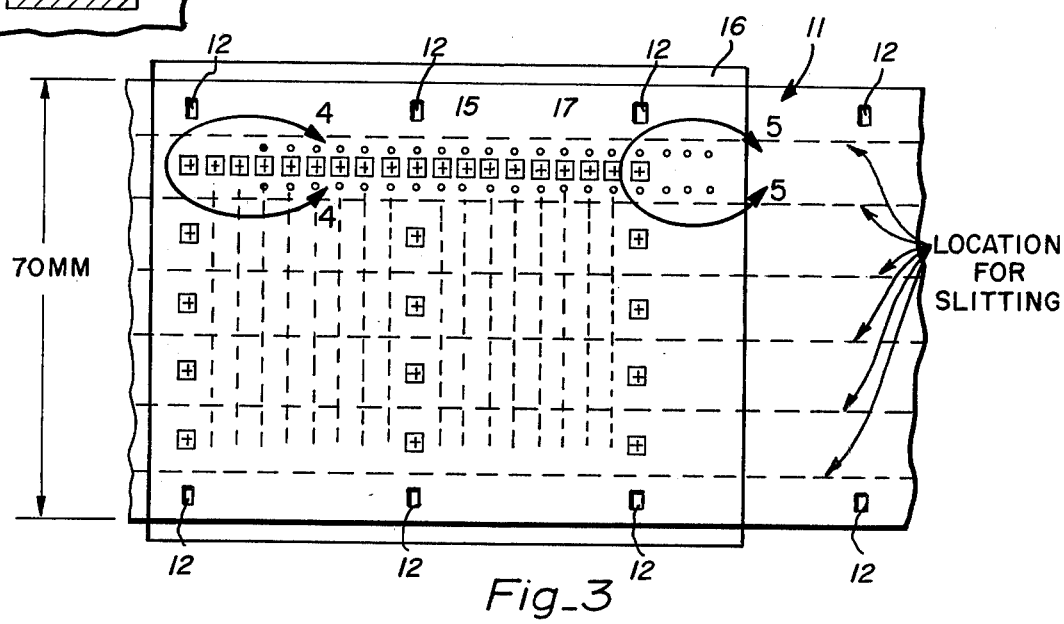
Fig_3
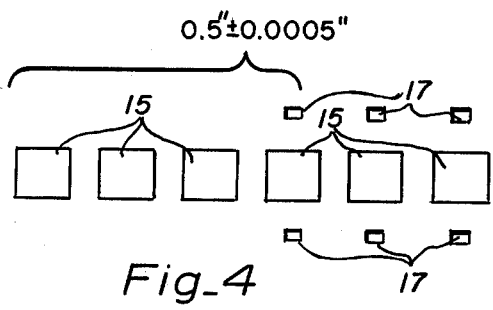
Fig_4
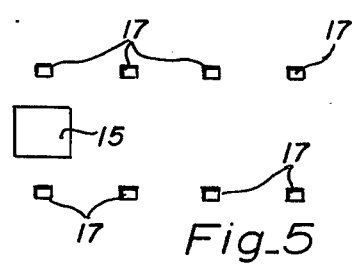
Fig_5

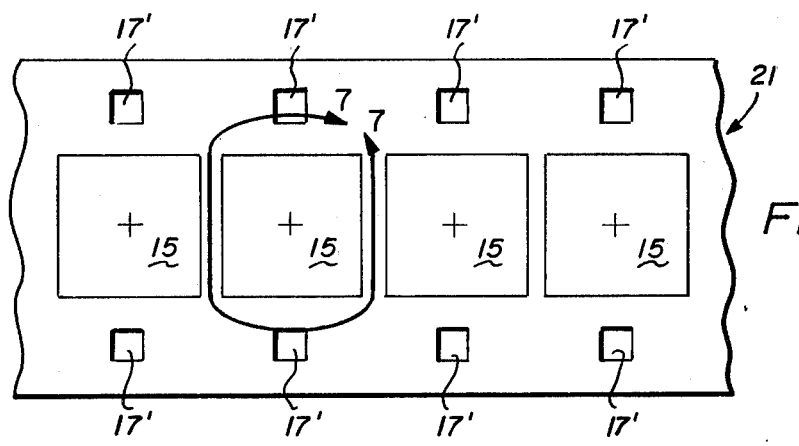
Fig_6
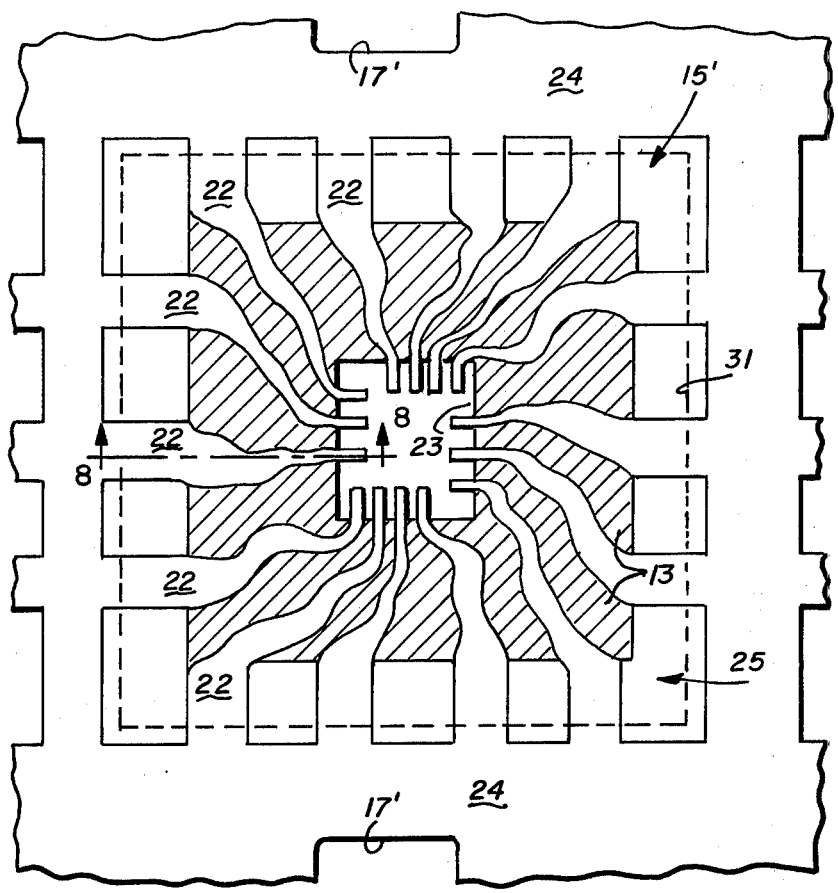
Fig_7
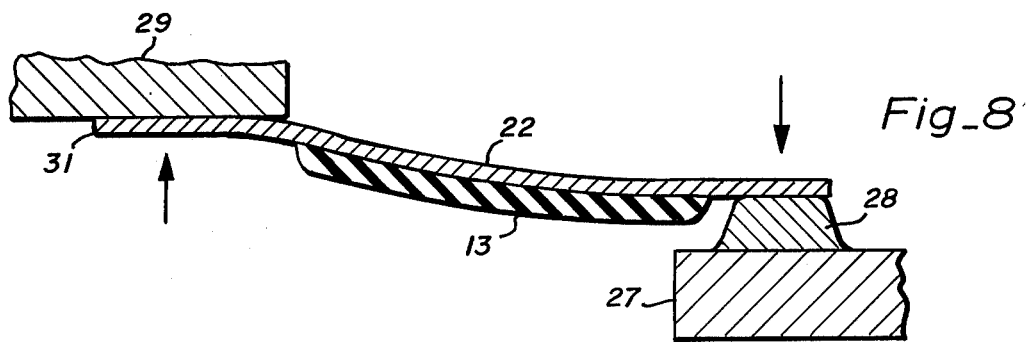
Fig_8

METHOD OF MAKING GANG BONDING INTERCONNECT TAPE FOR SEMICONDUCTIVE DEVICES

BACKGROUND OF THE INVENTION

The present invention relates in general to gang bonding interconnect tape for use in automatic gang bonding machines for gang bonding of semiconductive devices and to an improved tape and method of making same.

DESCRIPTION OF THE PRIOR ART

Heretofore, gang bonding interconnect tapes, having a series of interconnect patterns formed thereon, have been used in automatic gang bonding machines to gang bond the individual semiconductive dies to the inner ends of the individual lead patterns and for subsequent bonding of the outer regions of the interconnect lead patterns to a lead frame structure. In one prior method of fabricating the gang bonding interconnect tape, a 5 mil thick polyimide tape is coated on one side with a half mil thick layer of adhesive. The coated tape is then punched to provide outer sprocket holes and then centrally punched to provide the personality holes, i.e., the hole in the central region of the lead pattern to receive the die. The tape is also punched with a ring of apertures in the region of the outer lead bond to facilitate shearing of the interconnect lead pattern at the time of making of the outer lead bond to the lead frame structure. A 1.3 to 1.4 mil thick copper sheet is hot laminated over the adhesive coating to provide a laminated tape structure. The copper is coated with a layer of photoresist, and exposed to images corresponding to each of the individual interconnect lead patterns. The exposed tape is then developed, and etched to form the interconnect lead patterns in the copper sheet.

The resultant tape is fed through a first automatic gang bonding machines wherein the inner ends of the individual interconnect leads are thermal compression gang bonded to gang bonding bumps on the semiconductive device. In this first bonding step, the semiconductive device is transferred to the tape. The tape is then fed through a second automatic bonding machine wherein the individual lead patterns are sheared out of the tape and thermal compression gang bonded at their outer ends to the inner ends of a pattern of leads, such as a lead frame structure, printed circuit board or flexible circuit.

The problem with this first method of fabricating an automatic gang bonding interconnect tape is that the punching operations are relatively expensive in that the punches have only limited life and the polyimide is relatively expensive.

In a second method for fabricating an automatic gang bonding interconnect tape, a half mil thick polyimide coating is cast onto one side of a 1.3 to 1.4 mil thick copper tape. Next, the tape is coated with photoresist on both sides. The tape is then exposed simultaneously on both sides with different patterns of optical radiation, the copper side being exposed with patterns for the individual interconnect leads and the sprocket holes, whereas the polyimide side is exposed with patterns of radiation corresponding to the personality holes, the sprocket holes and the ring of perforations in the region of the shear line at the outer lead bond area. The polyimide side is then etched to provide the personality holes, the sprocket holes and the outer lead perforations. Next, the copper side is etched to provide the interconnect lead patterns, and the sprocket hole patterns. The resultant tape is then used in an automatic gang bonding machine in the same manner as previously described.

The problem with this latter method for fabrication of an automatic gang bonding interconnect tape is the cost of performing the two etching steps and, particularly, the etch of the polyimide side of the tape.

Therefore, it is desired to provide an improved method for manufacture of an automatic gang bonding interconnect tape which is less costly of manufacture and which avoids the multiple punching operations of the first method and the two different etching steps of the second method.

SUMMARY OF THE PRESENT INVENTION

The principal object of the present invention is the provision of an improved automatic gang bonding interconnect tape and method of making same.

In one feature of the present invention, a series of electrically insulative support structures are deposited onto a copper tape, there being at least one of said electrically insulative support structures or rings for individual ones of the interconnect lead patterns to be formed in the copper tape. A series of interconnect lead patterns is then formed in the tape with individual ones of the interconnect lead patterns being disposed in registration with individual ones of said electrically insulative support structures.

In another feature of the present invention the individual electrically insulative support structures are deposited onto the metallic (copper) tape by flowing the electrically insulative material through a patterned screen onto the metallic tape.

In another feature of the present invention, the electrically insulative support structures are made of an electrically insulative material selected from the group consisting of certain thermal setting and thermal plastics.

In another feature of the present invention, parallel rows of said electrically insulative support structures are deposited on the metallic tape. Parallel rows of metallic interconnect lead patterns are etched in registration with individual ones of the support structures. The tape is then slit parallel to the individual rows for separating same into individual gang bonding tapes.

In another feature of the present invention the metallic tape is punched at the outer edges thereof with a series of sprocket or locator holes utilized in subsequent steps of depositing the electrically insulative support structures on the tape and for use in exposing the photoresist coating to the patterns of radiation corresponding to individual ones of the interconnect lead patterns and associated locator holes.

Other features and advantages of the present invention will become apparent upon a perusal of the following specification taken in connection with the accompanying drawings wherein:

BRIEF DESCRIPTION OF THE DRAWINGS

FIG. 1 is a plan view of a metallic tape depicting the parallel rows of electrically insulative support structures deposited thereon, FIG. 2 is an enlarged view of a portion of the structure of FIG. 1 delineated by line 2—2, FIG. 3 is a view similar to that of FIG. 1 depicting the step of exposing the photoresist coated metallic tape to the patterns of radiation corresponding to the individual interconnect lead patterns and locator hole patterns, FIG. 4 is an enlarged detail view of a portion of the structure of FIG. 3 delineated by line 4—4, FIG. 5 is an enlarged detail view of a portion of the structure of FIG. 3 delineated by line 5—5, FIG. 6 is a plan view of one of the individual automatic gang bonding interconnect lead tapes after having been separated from the composite tape of FIG. 3, FIG. 7 is an enlarged detail view of a portion of the structure of FIG. 6 delineated by line 7—7, FIG. 8 is an enlarged sectional view of a portion of the interconnect lead structure of FIG. 7 as bonded to a die and to an outer lead frame.

DESCRIPTION OF THE PREFERRED EMBODIMENTS

Figure 9:
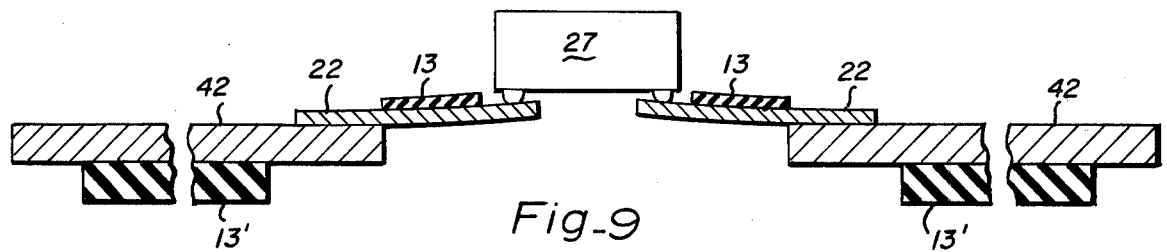
FIG. 9 is a sectional view of a semiconductor die bonded to a first interconnect lead pattern which is in turn bonded to a second surrounding interconnect lead pattern of FIG. 10.

Referring now to FIGS. 1 and 2, a 1000 foot roll of wrought copper sheet having a weight of one ounce per square foot or a thickness of 1.3 to 1.4 mils is slit into a 70 millimeter width to provide a copper tape 11. The copper tape 11 is preferably coated with copper phosphate or other materials, using conventional techniques, to promote adhesion of organic plastic materials to be subsequently applied to the copper tape. The copper tape is punched along opposite side marginal edges thereof with sprocket holes 12 to be utilized as locating holes. The holes 12 are spaced at 1.5 inch intervals along the length of the tape 11. The copper tape is then annealed and cleaned.

A pattern of electrically insulative support structures 13, such as rings, are then screened, as by screening, onto one face of the copper tape 11. In the screening process, the sprocket holes 11 are utilized as locating holes for indexing the screening pattern so as to provide proper indexing for the pattern of support structure 13. In a typical example of the screening step of the process, the support structures 13 are screened through a 3 × 3 inch screen pattern. The support structures 13 are deposited to a thickness of between 0.5 mils and 2 mils. The electrically insulative screening material 13 should be compatible with bonding temperatures of approximately 400° C for 0.1 second, have a pot life of 4 hours at 25° C, be flexible in thicknesses of 0.5 to 2.0 mils, and have the electrical properties of a good dielectric. Suitable electrically insulative support structure materials include thermal setting plastic materials and thermoplastic materials. The thermal setting plastic materials include, cycloaliphatic plastics with anhydride cure, low molecular weight bisphenol with anhydride cure, both cycloaliphatic and low molecular weight disphenol with phenolic cure, silicon material such as silanol and vinyl containing siloxane cured with an SIH siloxane, polyimide, polyamide, mixtures of polyimide and polamide, phenolics, and diallylphthalate with peroxide cure. Suitable thermoplastic materials include polysulphone, polycarbonate, and ABS. The use of these materials should be compatible with the temperatures encountered in subsequent bonding steps. Thus, for thermal compression bonding where temperatures of 450° C are encountered the aforecited epoxy and polyimide materials are most suitable.

A suitable epoxy for use in the screening step of the process includes anhydride cured cycloaliphatic epoxy resin which is liquid at room temperature and which has a relatively low viscosity at 25° C, that is, a viscosity less than 500 centipose. The epoxy resin includes a thixotroping agent to carry the viscosity from 500 to over 120,000 centipose and to provide a low yield value. A suitable thixotroping agent includes 7 to 8% by weight of fumed silica treated with silane or silazane so as to convert the silanol groups to trimethylsiloxy groups. This epoxy forms the subject matter of and is claimed in copending U.S. application Ser. No. 567,724 filed Apr. 14, 1975 and assigned to the same assignee as the present invention.

As an alternative to screening of the electrically insulative support structures 13 onto the copper tape 11 they may be applied by any one of a number of conventional methods such as injection molding, electrostatic spraying through a mask, or by transfer from a sheet of the material to the copper sheet.

For screening, the thermal setting materials are suitable when they include a suitable thixotropic agent. For electrostatic spraying through a mask, either the thermal setting materials or the thermoplastic materials may be utilized. For injection molding, either the thermal setting or thermoplastic materials may be utilized. For transfer molding, the thermal setting materials are suitable.

A number of different formats may be employed depending upon the size of the die which is to be bonded to the interconnect lead patterns to be formed on the tape. More particularly, these support structures 13 are screened onto the tape 11 in a number of parallel rows 14 extending longitudinally of the tape 11. The number of parallel rows 14 depends upon the width of the individual tapes which are to be subsequently formed by slitting of the master tape 11.

One format corresponds to an individual tape width of 11 millimeters to be utilized with a die size less than 60 × 60 mils, such pattern having a pitch P of 0.1667 inch, where the pitch is the longitudinal spacing between the center of adjacent support structures 13 of a given row, there being five rows 14 of such support structures 13 in the 70 millimeter width of the master tape 11. In such a case, a 3 inch length of the composite tape 11 will accommodate 90 support rings 13.

A second format corresponds to an individual tape width of 13.75 millimeters for accommodating die sizes less than 90 × 90 mils, such pattern having a pitch P of 0.214 inch and providing four rows 14 in the 70 millimeter width of the master tape 11 and 56 die locations per 3 inch length of the master tape 11.

A third format corresponds to an individual tape width of 16 millimeters to accommodate die sizes less than 200 mils by 200 mils, such pattern having a pitch P of 0.300 inch, there being three rows of such support structures 13 for a 70 millimeter wide master tape 11. This third format provides 30 die locations per 3 inch length of the master tape 11.

After the support structures 13 have been deposited on the tape 11, the tape is cured in an oven in an atmosphere of nitrogen gas so as to harden the individual support structures 13. At this point the tape 11 may be inventoried, if desired.

Next, the master tape 11 having the support structures 13 deposited thereon is cleaned of the adhesion promoting coating and any oxides thereon by appropriate etching and then coated with an antioxidant coating such as chromate to promote photoresist adherence. A number of suitable antioxidant coatings including chromate are disclosed and claimed in copending U.S. application Ser. No. 582,634 filed June 2, 1975 and assigned to the same assignee as the present invention. The chromate antioxidant coating is applied to the copper tape 11 by cleaning the copper tape with hydrochloric acid and then immersing the copper tape in a plating solution of chromic acid mixed with sulfuric acid, such mixture being 2.0% chromic acid to 8% full strength sulfuric acid to 90% deionized water by volume. The tape is immersed for 1 minute at room temperature then removed, rinsed in deionized water and dried. In this process, a chromate antioxidant coating is deposited on the copper surface to a thickness of between 10 and 100 angstroms.

Next, the composite tape 11 is coated on both sides with a positive type photoresist coating of conventional type utilized in the semiconductor art.

Next, the side of the tape 11 which is opposite to that containing the support structures 13 is exposed to patterns 15 of optical radiation to which the photoresist material is sensitive. The patterns 15 of radiation are produced by a conventional 4 × 4 inch photo mask as utilized in the semiconductor art (see FIGS. 3-5). The mask 16 has thereon an array of patterns 15 corresponding to the individual interconnect lead patterns to be formed in the copper tape 11. In a typical example, the mask 16 exposes a three inch length of the tape 11. In addition to the individual interconnect lead patterns 15, the mask contains patterns 17 corresponding to sprocket holes 17' for each of the tapes which are to be subsequently split from the master tape 11.

Due to a peculiarity of the automatic gang bonding interconnect machines, the sprocket locator holes 17' for a given interconnect pattern 15 must be axially displaced along the tape from the particular lead pattern of interest by approximately 0.5 inch for the 11 mm, 0.642 inch for the 13.75 mm and 0.6 inch for the 16 mm $\pm \approx$ 0.0005 inch. Thus, in the case of the 11 mm format the interconnect patterns 15 on the mask at the leading edge thereof have their respective sprocket holes 17 trailing by 0.5 inch as shown in FIG. 4. Similarly, at the trailing edge of the mask 16 the pattern for the sprocket holes 17 lags behind the respective interconnect pattern 15 by 0.5 inch. Thus, the individual tape sprocket holes 17 are indexed to the respective lead portions 15 via the mask 16 to a tolerance of ± 0.0005 inch.

On the other hand, the mask 16 is indexed to the tape 11 by means of the sprocket holes 12 at the marginal edge of the master tape 11. These sprocket holes 12 can provide indexing of the mask 16 to the pattern of insulative support structures 13 to ± 5 mils. At the overlap of one set of patterns 15 exposed on the tape 11 through the mask 16 to a subsequent set of patterns exposed through the mask 16 the overlap tolerance is ± 5 mils as provided by the sprocket holes 12. However, the automatic gang bonding machine has the capability of picking up or releasing the individual tape to compensate for the up to ± 30 mil jump in spacing of the sprocket holes 17 at the overlap of two patterns. The method of indexing the lead patterns 15 to their respective locator holes on the mask 16 and indexing the mask to the tape 11 via the sprocket holes 12 is disclosed and claimed in copending U.S. application Ser. No. 593,477 filed July 7, 1975 and assigned to the same assignee as the present invention. Suitable automatic gang bonding interconnect machines are the ILB and OLB Model No. 1-1000 manufactured and marketed by Jade Corporation of Philadelphia, Penn.

Next, the exposed photoresist coating is developed and removed by conventional methods. The copper tape 11 is then etched through the removed portions of the photoresist coating. The etched copper tape is then stripped of the photoresist coating to form the individual interconnect patterns 15' and sprocket holes 17'.

Next, the composite tape 11 is slit into the appropriate number of individual tape strips 21, as shown in FIGS. 6 and 7, such slitting occurring inbetween adjacent rows of sprocket holes 17'. The individual gang bonding interconnect tapes 21 include a series of virgin sprocket holes 17' along opposite marginal side edges thereof and a series of gang bonding interconnect lead patterns 15' formed therein.

The individual patterns 15' are personalized to the particular semiconductive die type to which they are to be bonded and each includes an array of ribbon-shaped leads 22 extending outwardly from a central aperture 23 (personality hole) to an outer region 24 of the copper tape 21. The marginal edge of the personality hole 23 is defined by the inner lip of the electrically insulative support structure 13 (ring) and the ring 13 has sufficient radial extent to provide sufficient support for the individual leads 22 and to hold the leads 22 in the desired circumferentially spaced position in electrically insulative relation. The inner ends of the leads 22 overhang the inner periphery of the personality hole 23 for bonding to gang bonding bumps on the semiconductive die.

An annular gap 25 is defined between the outer periphery of the electrically insulative support structure 13 and the inner lip of the frame portion 24. This gap 25 is provided to facilitate shearing of the individual leads 22 at their outer regions at the time that the interconnect lead pattern 15 is thermal compression bonded to the inner lip of the lead frame structure, as more fully described below with regard to FIG. 8.

After the individual tapes 21 have been separated from the composite tape 11 they are inspected and spliced together into long lengths as of 1000 feet. The tape is then utilized in the conventional manner with conventional automatic gang bonding interconnect machines such as the aforementioned Jade Model No. 1-100. Briefly, in these automatic gang bonding interconnect machines, as shown in FIG. 8, a semiconductive die 27, having a plurality, such as 14, gang bonding bumps 28 formed thereon, is indexed with an individual personality hole 23 by the gang bonding machine.

The gang bonding bumps typically have a height of between 1.0 and 2.0 mils and are connected at their bases to patterns of intraconnect metallization on the semiconductive die 27. The inner ends of the leads 22 are thermal compression bonded to the gang bonding bumps 28 by the gang bonding tool, not shown, which presses the inner ends of the leads 22 down against the upper surface of the gang bonding bumps 28. In a typical example the gang bonding tool is made of carbon and heated to a temperature of, for example, 550° C and presses the inner ends of the interconnect leads down against the gang bonding bumps with a pressure of approximately 8 grams per square mil for a time of approximately 0.2 seconds. The gang bonding tool gang bonds 14 of such gang bonding bumps to their respective interconnect leads 22 simultaneously.

The die 27 is held to a base support structure via a release wax and due to the heating of the die by the thermal compression tool, the wax releases the die and it is thereby transferred to the tape 21. The tape 21 with the dies 27 attached thereto is fed through a second gang bonding machine which thermal compression bonds the outer portions of the interconnect leads 22 to the inner ends of a set of lead frame members 29. For bonding the inner ends of the lead frames 29 to the outer ends of the interconnect leads 22, the thermal compression tool, not shown, is brought up against the lower side of the interconnect leads 22 for pressing the upper surface of the interconnect leads into engagement with the lower surface of the lead frame structure 29. In a typical example, the temperature of the bonding tool for the outer lead bond is approximately 450° C and is held in engagement with the interconnect leads for approximately 0.15 seconds with a bonding pressure of approximately 25 grams per square mil.

As the thermal compression bond is made between the interconnect lead 22 and the inner ends of the lead frame 29, the copper interconnect lead pattern 15' is sheared along a shear line 31 located just inside the outer marginal edge of the interconnect lead pattern 15'. In this manner, the lead attached die 27 is transferred from the tape 21 to the leadframe structure 29.

The advantages of the automatic gang bonding interconnect tape 21 and the method of fabricating same according to the present invention include, reduction of manufacturing cost of the tape 21 and that the master tape 11 with the support structures 13 affixed thereto is less costly to inventory than the prior tape systems. In addition, the individual tapes 21 have virgin sprocket or locator holes 17' for use in the inner lead gang bonding machine.

Figure 10:
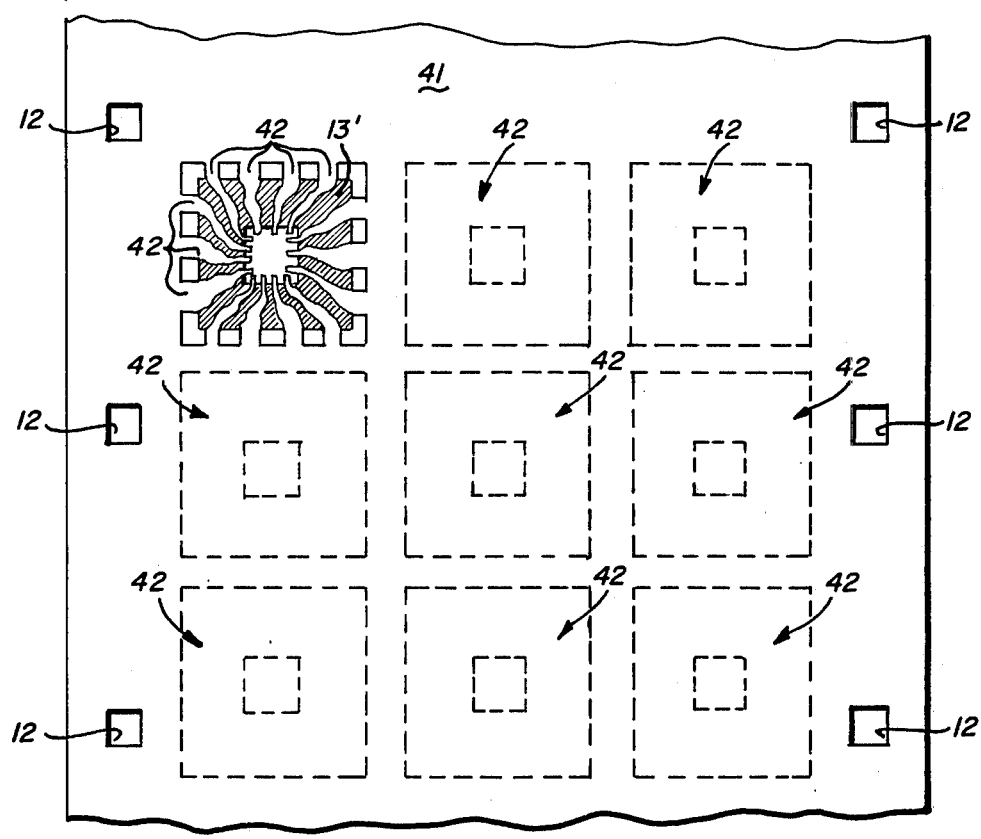
FIG. 10 is a schematic plan view of an alternative interconnect tape embodiment of the present invention.

In an alternative embodiment of the present invention, see FIGS. 9 and 10, a 70 mm wide copper tape 41, as of 2.6 mil thickness, is punched with sprocket holes 12 and treated with an adhesion promoting agent, as before described. Patterns of electrically insulative support structures 13', such as rings, are screened, or otherwise applied, onto one face of the copper tape 41, as before described. The tape 11 is cured and etched, as before described, to define certain interconnect lead patterns 42 which are to form lead patterns for making gang bonding connections to the outer ends of respective ones of the interconnect leads 22, as previously bonded at their inner ends to the dies 27. The interconnect lead patterns 42, thus, take the place of the lead frame 29 of the previous example and the dies 27 are transferred to the flexible lead patterns 42 upon making of the gang bond between the outer ends of the inner interconnect lead patterns 22 and the inner ends of the outer interconnect lead pattern 42. Thus the latter interconnect lead pattern 42 is similar to a flexible printed circuit board and may be punched from the tape 41 along outer shear lines 44 of the pattern for bonding or otherwise being interconnected to other electrical circuitry at the outer margin thereof.

In this latter embodiment, additional insulative structures, such as a grid pattern, are deposited at the time of depositing the insulative rings for further strengthening of the lead patterns located outside of the bonding area.

What is claimed is:

1. In a method for fabrication of a gang bonding interconnect tape for interconnecting a first pattern of leads and a second pattern of leads, such interconnect tape having a series of metallic interconnectlead patterns thereon, individual ones of said lead patterns including a plurality of ribbon-shaped metallic leads extending outwardly from an inner central portion of said pattern to an outer region of said pattern and including an individual electrically insulative support structure interconnecting a plurality of said ribbon-shaped metallic leads in a region of said pattern intermediate said outer region thereof and said inner central region thereof, the steps of:

depositing a series of said individual electrically insulative support structures onto said metallic tape, there being at least one of said individual electrically insulative support structures for individual ones of said interconnect lead patterns to be formed in said metallic tape.

2. The method of claim 1 including the step of, forming a series of said interconnect lead patterns in said metallic tape, individual ones of said lead patterns being formed in registration with individual ones of said electrically insulative support structures so as to locate individual ones of said electrically insulative support structures in a region of individual ones of said lead patterns intermediate said inner central region thereof and said outer region thereof.

3. The method of claim 2 wherein the step of forming said series of said lead patterns in said tape comprises the steps of, coating the side of said tape opposite to said deposited series of electrically insulative support structures with a photoresist coating, exposing the photoresist coating to a series of radiation images each of said images corresponding to individual ones of said interconnect lead patterns to be formed in said tape, removing the photoresist coating in the exposed patterns, and etching the tape in the regions of the removed photoresist coating to form said interconnect patterns therein.

4. The method of claim 2 wherein the step of forming said series of said lead patterns in said tape comprises the steps of, coating the side of said tape opposite to said deposited series of electrically insulative support structures with a photoresist coating, exposing said photoresist coating to parallel rows of radiation images, each of said images corresponding to individual ones of said interconnect patterns to be formed in said tape, removing the photoresist coating in the exposed patterns, and etching said tape in the regions of the removed photoresist coating to form rows of interconnect patterns therein.

5. The method of claim 4 including the step of slitting said tape in the regions thereof between and parallel to said rows of interconnect patterns to slit the tape into a plurality of tapes each having a row of said interconnect patterns thereon.

6. The method of claim 4 including the step of, punching a series of locator holes in said tape prior to the step of exposing said tape to said rows of radiation images.

7. The method of claim 4 wherein said step of exposing said tape to said rows of interconnect patterns includes the step of, exposing said tape to rows of radiation images corresponding to rows of locator holes to be formed in said tape there being at least one such row of locator hole images for each row of interconnect pattern images, and wherein the step of etching the tape includes, etching said rows of locator hole images to form at least one row of locator holes for each row of said interconnect patterns formed in said tape.

8. The method of claim 1 wherein the step of depositing said series of electrically insulative support structures on said metallic tape includes the step of, depositing a series of individual electrically insulative support rings on said tape to serve as said series of support structures.

9. The method of claim 1 wherein said tape is elongated and wherein the step of depositing said series of electrically insulative support structures on said metallic tape includes the step of, depositing rows of said electrically insulative support structures on said tape, said rows extending generally in the direction of elongation of said tape.

10. The method of claim 1 wherein said tape is made of copper.

11. The method of claim 1 wherein said step of depositing said series of electrically insulative support structures on said tape comprises the step of, flowing an electrically insulative material through a patterned screen onto said tape as a series pattern of electrically insulative portions, and allowing the electrically insulative patterns to harden into said series of electrically insulative support structures.

* * * * *